United States Patent
Jones et al.

Patent Number: 5,473,561
Date of Patent: Dec. 5, 1995

[54] BICMOS CACHE TAG HAVING ECL REDUCTION CIRCUIT WITH CMOS OUTPUT

[75] Inventors: Kenneth W. Jones; Mark D. Bader, both of Austin; Ketan B. Shah, Round Rock, all of Tex.

[73] Assignee: Motorola Inc., Schaumburg, Ill.

[21] Appl. No.: 306,565

[22] Filed: Sep. 15, 1994

[51] Int. Cl.$^6$ .................................................. G11C 15/00
[52] U.S. Cl. ........................ 365/49; 365/189.07; 395/403
[58] Field of Search ..................... 365/49, 189.07; 395/425

[56] References Cited

U.S. PATENT DOCUMENTS

| | | | |
|---|---|---|---|
| 5,218,567 | 6/1993 | Suzuki et al. | 365/49 |
| 5,241,510 | 8/1993 | Kobayashi et al. | 365/49 X |
| 5,253,197 | 10/1993 | Suzuki et al. | 365/49 |
| 5,329,632 | 7/1994 | Lee et al. | 395/425 |

*Primary Examiner*—David C. Nelms
*Assistant Examiner*—Son Dinh
*Attorney, Agent, or Firm*—Daniel D. Hill

[57] ABSTRACT

A cache TAG RAM (25) includes a reduction circuit (39) for comparing match signals from a plurality of exclusive OR logic circuits (33, 34) and provides a hit signal when all of the TAG address bits of a stored TAG address is the same as input address bits. The reduction circuit (39) provides a miss signal when any one or more of the bits of the stored TAG address is not the same as the corresponding bits of the input address bits. In one embodiment, the reduction circuit (39) uses a plurality of transistors (77, 78) coupled to a conductor (75) for discharging the conductor (75) if one of the exclusive OR logic circuits (33, 34) indicates a miss. In another embodiment, the reduction circuit (39") charges the conductor. The comparison can be made using signals having small signal swing at high speed, and a reference voltage is not needed for the comparison.

17 Claims, 6 Drawing Sheets

BICMOS CACHE TAG HAVING ECL REDUCTION CIRCUIT WITH CMOS OUTPUT

CROSS REFERENCE TO RELATED APPLICATIONS

1. A related application entitled "BICMOS Cache TAG Comparator Having Redundancy and Separate Read and Compare Paths", by Feng, and having Attorney Docket Number SC02442A, was filed on Jun. 24, 1994, and assigned to the assignee hereof.

2. A related application entitled "BICMOS Cache TAG Having Small Signal Exclusive OR For TAG Comparison", by Lewis et al., and having Attorney Docket Number SC02544A, is filed concurrently herewith, and assigned to the assignee hereof.

FIELD OF THE INVENTION

This invention relates generally to memories, and more particularly, to a BICMOS cache TAG having an ECL reduction circuit with a CMOS output.

BACKGROUND OF THE INVENTION

A cache is a relatively small, high speed memory that is used to increase the speed of a data processing system. The access time of the cache is about the same as a central processing unit (CPU) logic propagation delay. The cache stores frequently used instructions or data to reduce the number of accesses between the CPU and a relatively slower main memory, thus improving system performance.

A cache TAG RAM is frequently used to increase the performance of the cache. The cache TAG RAM receives an address that is provided by the processor and determines if the requested instructions or data are present in the cache memory. Like the cache, the cache TAG RAM has an array of conventional static random access memory (SRAM) cells. A cache TAG RAM typically has two operating modes: write mode; and read/compare mode. When data is written into the cache memory, the higher order bits of the address of the data are stored in the TAG array. When in the read/compare mode, the cache TAG RAM has a comparator that compares a processor generated address to the TAG address. If the TAG address and the processor generated address are the same, a cache "hit" occurs, and a match signal of a predetermined logic state is provided by the cache TAG RAM, indicating that the requested data is located in the cache memory. If the processor generated address and the TAG address are not the same, a cache "miss" occurs, and a match signal of an opposite logic state is provided by the cache TAG RAM, indicating that the requested data is not located in the cache memory.

It is important for the match signal to be generated as quickly as possible after the cache TAG comparator receives the data to be compared. In a prior art cache TAG RAM, the read mode and the compare mode generally share the same data path. FIG. 1 illustrates in block diagram form, a cache TAG RAM 10 in accordance with the prior art. Cache TAG RAM 10 includes a TAG array 11, row decoding 12, column decoding 13, level shifting circuits 14 and 15, sense amplifiers 16 and 17, exclusive OR circuits 18 and 19, and reduction circuit 20. Cache TAG RAM 10 receives address bits labeled "$AD_0$" through "$AD_M$". Address bits $AD_0$-$AD_N$ include the most significant bits of the address, and address bits $AD_{N+1}$-$AD_M$ are the least significant bits of the address.

In response to receiving address signals $AD_{N+1}$-$AD_M$, TAG array 11 provides differential data signals $DIF_0$/$DIF_0$* through $DIF_N$/$DIF_N$*. Note that an asterisk (*) after a signal name indicates that the signal is a logical complement of a signal having the same name but lacking the asterisk (*). Differential data signals $DIF_0$/$DIF_0$* through $DIF_N$/$DIF_N$* are level shifted and amplified. Exclusive OR circuits 18 and 19 are used to compare data signals $DATA_0$ through $DATA_N$ to address bits $AD_0$-$AD_N$. If all of exclusive OR circuits 18 and 19 provide a match signal indicating the TAG address stored in TAG array 11 is the same as the address of the requested data, then a HIT signal is provided by reduction circuit 20. The cache memory (not shown in FIG. 1) provides the requested data or instructions to the data processing system.

Reduction circuit 20 of the prior art cache TAG RAM 10 typically compares the logic states of match signals $MATCH_0$ through $MATCH_N$ to a reference voltage to determine a hit or a miss. The reference voltage is provided at a voltage level that is about half way between a logic high voltage and a logic low voltage of match signals $MATCH_0$ through $MATCH_N$. If the logic swing of match signals $MATCH_0$ through $MATCH_N$ is relatively small, the accuracy of the reference voltage has to be maintained within a narrow margin, complicating circuit design.

SUMMARY OF THE INVENTION

Accordingly, there is provided, in one form, a cache TAG RAM, having a plurality of memory cells, a plurality of exclusive OR logic circuits, and a plurality of transistors. The plurality of memory cells store TAG addresses corresponding to address locations of data stored in a cache memory. The plurality of memory cells provides the TAG address in response to receiving an input address. Each exclusive OR logic circuit of the plurality of exclusive OR logic circuits has an input terminal coupled to the plurality of memory cells. The exclusive OR logic circuit is for receiving a data signal corresponding to a TAG address bit of the TAG address. Each exclusive OR circuit compares a logic state of the data signal to a logic state of an input TAG address signal, and in response, provides a match signal of a predetermined logic state at an output terminal. Each transistor of the plurality of transistors has a control electrode coupled to the output terminal of each exclusive OR logic circuit of the plurality of exclusive OR logic circuits. A first current electrode of each transistor of the plurality of transistors are coupled together, and a second current electrode is coupled to a first power supply voltage terminal. These and other features and advantages will be more clearly understood from the following detailed description taken in conjunction with the accompanying drawings.

DESCRIPTION OF A PREFERRED EMBODIMENT

Generally, the present invention provides a cache TAG RAM that includes a reduction circuit for comparing match signals from a plurality of exclusive OR logic circuits and providing a hit signal when all of the TAG address bits of a TAG address stored in a TAG array have the same logic state as corresponding higher order input address bits, and providing a miss signal when any one or more of the TAG address bits of the TAG address stored in the TAG array is not the same as the corresponding bits of the higher order input address bits. The reduction circuit, in one embodiment, uses a plurality of transistors coupled to a conductor for discharging the conductor if one of the exclusive OR logic circuits indicates a miss. In another embodiment, the reduction circuit charges the conductor in the event of a miss. The reduction circuit provides the advantage of not requiring a reference voltage to perform the comparison. Also, the comparison can be made using signals having relatively small signal swing at relatively high speed.

Figure 1:
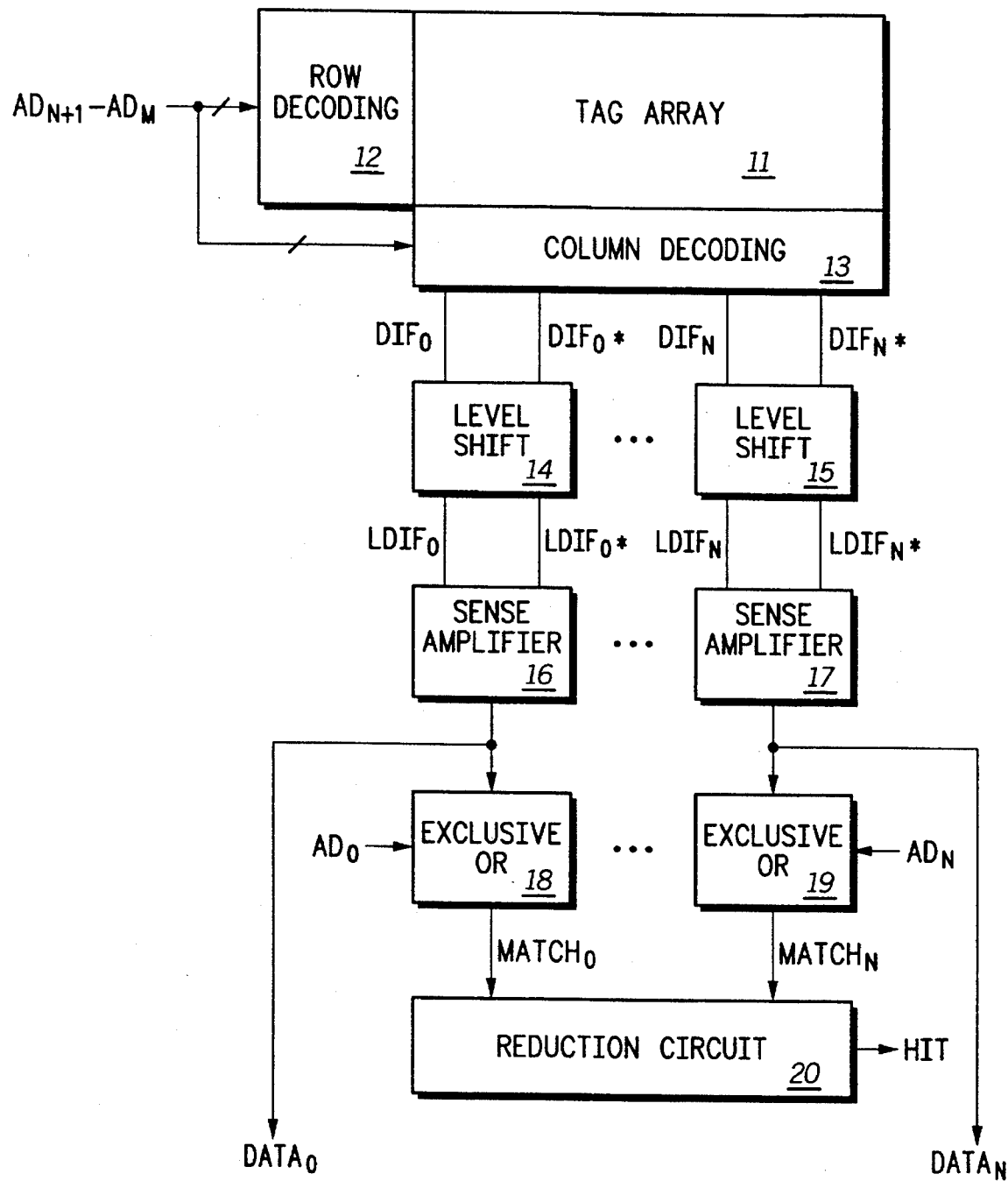
FIG. 1 illustrates in block diagram form, a cache TAG RAM in accordance with the prior art.
Figure 2:
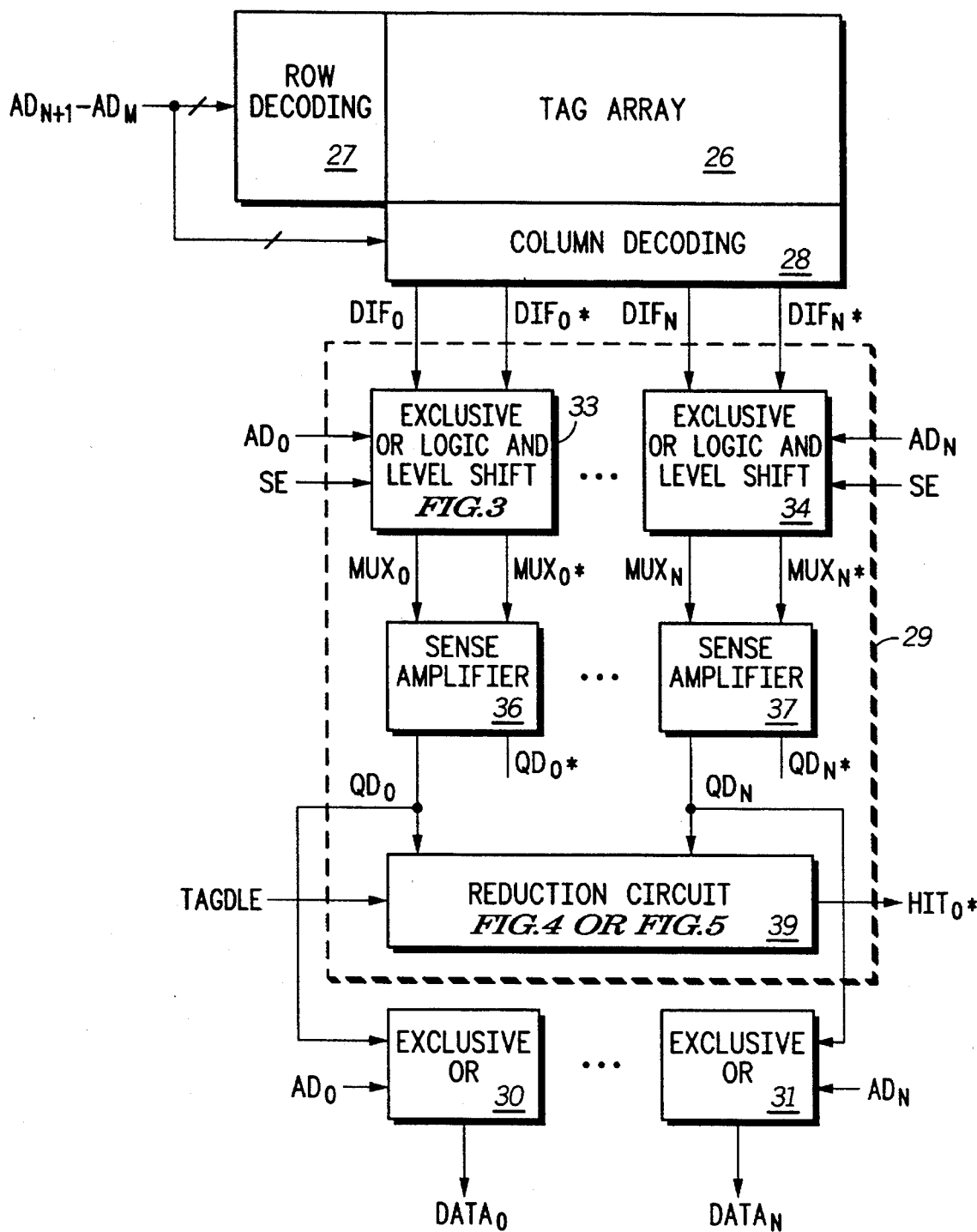
FIG. 2 illustrates in block diagram form, a cache TAG RAM in accordance with the present invention.

The present invention can be more fully described with reference to FIGS. 2–6. FIG. 2 illustrates in block diagram form, cache TAG RAM 25 in accordance with the present invention. Cache TAG RAM 25 includes TAG array 26, row decoding 27, column decoding 28, comparison circuit 29, and CMOS exclusive OR circuits 30 and 31. Comparison circuit 29 includes small signal exclusive OR logic and level shift circuits 33 and 34, sense amplifiers 36 and 37, and reduction circuit 39. There are a predetermined number of input/output circuits in cache TAG RAM 25. Exclusive OR logic and level shift circuit 33, sense amplifier 36, and CMOS exclusive OR circuit 30 comprise one input/output of cache TAG RAM 25. Exclusive OR logic and level shift circuit 34, sense amplifier 37, and CMOS exclusive OR circuit 31 comprise another input/output of cache TAG RAM 25. An input/output circuit corresponds to one bit of data from TAG array 26. The predetermined number of input/outputs of cache TAG RAM 25 is determined by the number of bits in a TAG address stored in cache TAG RAM 25 and may be different in different embodiments.

In a preferred embodiment, TAG array 26 is a conventional memory array including a plurality of static random access memory (SRAM) cells arranged in rows and columns. In other embodiments, TAG array 26 may include other types of memory cells such as dynamic random access memory (DRAM) cells. Each memory cell is coupled to a word line and a bit line pair. Row decoding 27 and column decoding 28 receives lower order address bits $AD_{N+1}$-$AD_M$ to select a word line and to couple a bit line pair to comparison circuits 29. Address bits $AD_0$-$AD_N$ represent higher order address bits of an address to be compared. Exclusive OR logic and level shift circuit 33 receives differential data signals labeled "$DIF_0/DIF_0*$" and address bit labeled "$AD_0$". Differential data signals $DIF_0/DIF_0*$ correspond to data stored in a selected memory cell of TAG array 26. Exclusive OR logic and level shift circuit 33 compares differential data signals $DIF_0/DIF_0*$ to address bit AD0, and provides a logic high differential match signal labeled "$MUX_0/MUX_0*$" if the logic state of differential data signals $DIF_0/DIF_0*$ is the same as the logic state of address bit ADO, provides a logic low differential match signal $MUX_0/MUX_0*$ if the logic state of differential data signals $DIF_0/DIF_0*$ is not the same as the logic state of address bit $AD_0$.

Sense amplifier 36 is a conventional sense amplifier for sensing and amplifying the relatively small differential match signals $MUX_0/MUX_0*$. An output terminal of sense amplifier 36 is coupled to an input terminal of reduction circuit 39. Reduction circuit 39 receives amplified match signals labeled "$QD_0$" through "$QD_N$", and as a result, provides an active low hit signal labeled "$HIT_0*$".

Match signals $QD_0$ through $QD_N$ and higher order address bits $AD_0$ through AND are also provided to CMOS exclusive OR circuits 30 and 31. In response, data signals DATA0 through DATAN are provided that correspond to the original differential data signals $DIF_0/DIF_0*$ through $DIF_N/DIF_N*$. By exclusive ORing the match signals with the address bits, the original data stored in TAG array 26 is recovered. The read data from TAG array 26 takes longer to output, but the match signal is provided much more quickly because the comparison is accomplished first using relatively small signals. Also, the input loading can be made relatively small so that sense amplifiers 36 and 37 can drive match signals $QD_0$ through $QD_N$ more quickly. Data signals $DATA_0$ through $DATA_N$ are CMOS level signals. A CMOS level signal swings from logic high voltage that is equal to about $V_{DD}$ to a logic low voltage equal to about $V_{SS}$.

Figure 3:
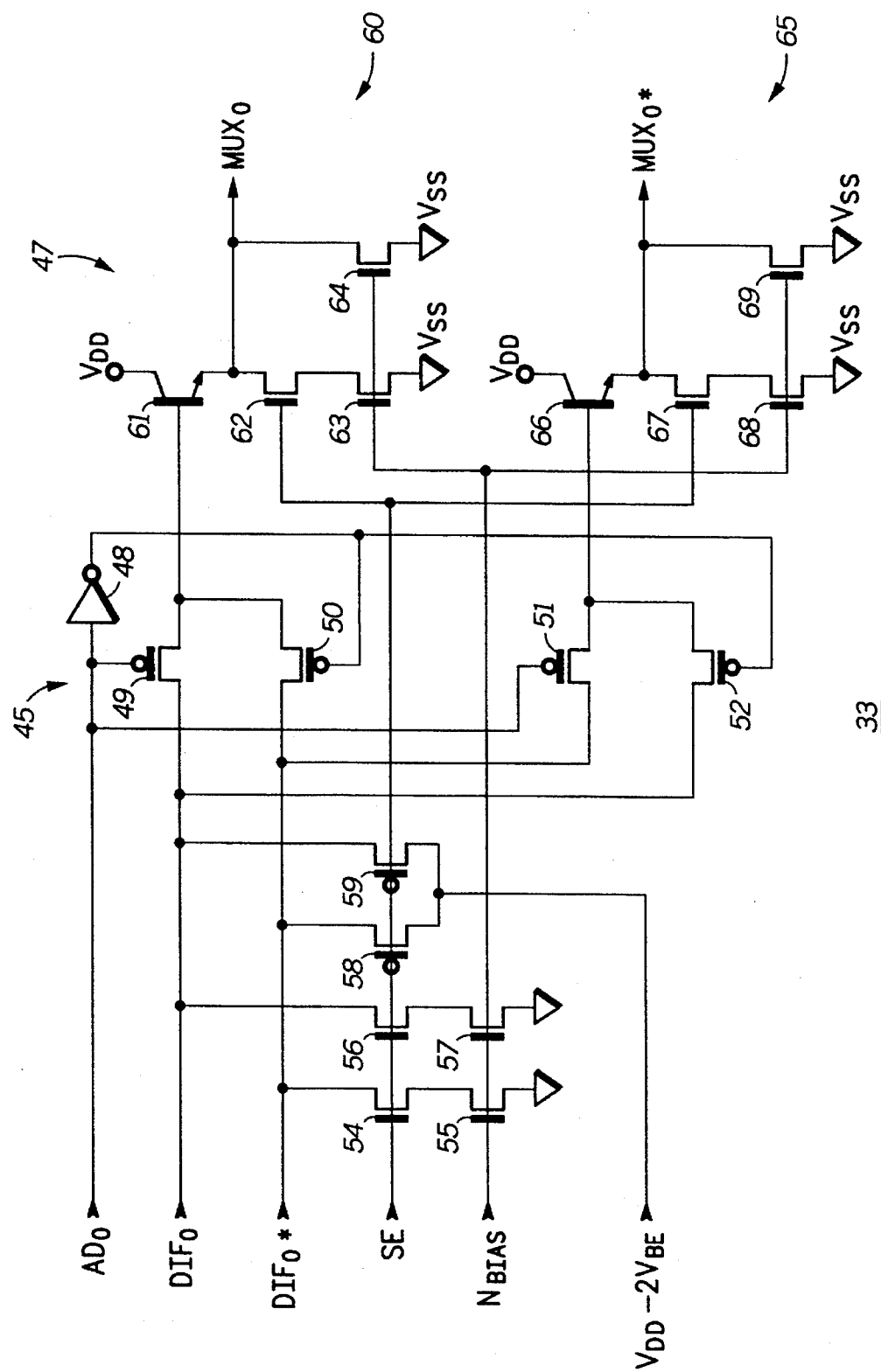
FIG. 3 illustrates in partial schematic diagram form and partial logic diagram form, a small signal exclusive OR logic and level shift circuit of the cache TAG RAM of FIG. 2.

FIG. 3 illustrates in partial schematic diagram form and partial logic diagram form, small signal exclusive OR logic and level shift circuit 33 of cache TAG RAM 25 of FIG. 2. Small signal exclusive OR logic and level shift circuit 33 includes small signal exclusive OR circuit 45 and level shift circuits 47. Small signal exclusive OR circuit 45 includes N-channel transistors 54–57, P-channel transistors 49–52, 58, and 59, and inverter 48. Level shift circuits 47 includes level shift circuits 60 and 65. Level shift circuit 60 includes NPN bipolar transistor 61 and N-channel transistor 62–64. Level shift circuit 65 includes NPN bipolar transistor 66 and N-channel transistors 67–69.

Inverter 48 has an input terminal for receiving single-ended address bit $AD_0$, and an output terminal. P-channel transistor 49 has a first source/drain terminal for receiving data signal DIF, a gate connected to the input terminal of inverter 48, and a second source/drain terminal. P-channel transistor 50 has a first source/drain terminal for receiving data signal DIF*, a gate connected to the output terminal of inverter 48, and a second source/drain terminal connected to the second source/drain terminal of P-channel transistor 49. P-channel transistor 51 has a first source/drain terminal connected to the first source/drain terminal of P-channel transistor 50, a gate connected to the input terminal of inverter 48, and a second source/drain terminal. P-channel transistor 52 has a first source/drain terminal connected to the first source/drain terminal of P-channel transistor 49, a gate connected to the output terminal of inverter 48, and a second source/drain terminal connected to the second source/drain terminal of P-channel transistor 51.

N-channel transistor 54 has a drain connected to the first source/drain terminal of P-channel transistor 50, a gate for receiving an enable signal labeled "SE", and a source. N-channel transistor 55 has a drain connected to the source of N-channel transistor 54, a gate for receiving a bias voltage labeled "$N_{BIAS}$", and a source connected to a power supply voltage terminal labeled "$V_{SS}$". N-channel transistor 56 has a drain connected to the first source/drain terminal of P-channel transistor 49, a gate for receiving enable signal SE, and a source. N-channel transistor 57 has a drain connected to the source of N-channel transistor 56, a gate for receiving bias voltage NBIAS, and a source connected to $V_{SS}$. P-channel transistor 58 has a source connected to the first source/drain terminal of P-channel transistor 50, a gate for receiving enable signal SE, and a second source/drain terminal connected to a supply voltage terminal labeled "$V_{DD}$-$2V_{BE}$". P-channel transistor 59 has a source connected to the first source/drain terminal of P-channel transistor 49, a gate for receiving enable signal SE, and a drain connected to $V_{DD}$-$2V_{BE}$.

NPN transistor 61 has a collector connected to a power supply voltage terminal labeled "$V_{DD}$", a base connected to the second source/drain terminals of P-channel transistors 49 and 50, and an emitter for providing match signal MUX. N-channel transistor 62 has a drain connected to the emitter of NPN transistor 61, a gate for receiving enable signal SE, and a source. N-channel transistor 63 has a drain connected to the source of N-channel transistor 62, a gate for receiving bias voltage NBIAS, and a source connected to $V_{SS}$. N-channel transistor 64 has a drain connected to the emitter of NPN transistor 61, a gate for receiving bias voltage NBIAS, and a source connected to $V_{SS}$. In a preferred embodiment, $V_{DD}$ is coupled to a positive power supply voltage and $V_{SS}$ is coupled to zero volts, or ground. In other embodiments, $V_{DD}$ may be coupled to ground and $V_{SS}$ coupled to a negative power supply voltage.

NPN transistor 66 has a collector connected to $V_{DD}$, a base connected to the second source/drain terminals of P-channel transistors 51 and 52, and an emitter for providing match signal MUX*. N-channel transistor 67 has a drain connected to the emitter of NPN transistor 66, a gate for receiving enable signal SE, and a source. N-channel transistor 68 has a drain connected to the source of N-channel transistor 67, a gate for receiving bias voltage $N_{BIAS}$, and a source connected to $V_{SS}$.

In operation, address bit $AD_0$ is exclusive ORed with differential data signals $DIF_0$/$DIF_0$*. If the logic state of address bit $AD_0$ is the same as the logic state of differential data signals $DIF_0$/$DIF_0$*, differential match signals $MUX_0$ and $MUX_0$* are provided as a logic low and a logic high, respectively. Conversely, if the logic state of address bit $AD_0$ is not the same as the logic state of differential data signals $DIF_0$/$DIF_0$*, differential match signals $MUX_0$ and $MUX_0$* are provided as a logic high and a logic low, respectively. Address bit $AD_0$ is provided as a CMOS level signal, and differential data signals $DIF_0$/$DIF_0$* are at relatively small signal levels, and in the illustrated embodiment, are provided at about 150 millivolts between a logic high and a logic low voltage. Differential match signals $MUX_0$ and $MUX_0$* are also at the relatively small logic levels of 150 millivolts, but have been level shifted down in voltage by one base-emitter diode voltage drop (VBE) from differential data signals $DIF_0$/$DIF_0$*. Differential data signals $DIF_0$/$DIF_0$* are provided at about one $V_{BE}$ below $V_{DD}$.

Sense enable signal SE is provided by a cache controller (not shown), and enables small signal exclusive OR logic and level shift circuit 33 when asserted as a logic high voltage, and disables small signal exclusive OR logic and level shift circuit 33 when it is deasserted as a logic low voltage. When sense enable signal SE is a logic high voltage, N-channel transistors 54, 56, 62, and 67 are conductive and P-channel transistors 58 and 59 are substantially non-conductive, causing both of differential data signals $DIF_0$ and $DIF_0$* to be reduced to a $V_{BE}$ below the base of an emitter-follower transistor (not shown) for providing differential data signals $DIF_0$/$DIF_0$*. When sense enable signal SE is a logic low voltage, N-channel transistors 54, 56, 62, and 67 are substantially non-conductive, and P-channel transistors 58 and 59 are conductive. A voltage equal to about $V_{DD}$-$2V_{BE}$ is provided to the first source/drain terminal of P-channel transistors 49 and 50, thus setting a mid-level voltage for differential data signals $DIF_0$ and $DIF_0$*.

Figure 4:
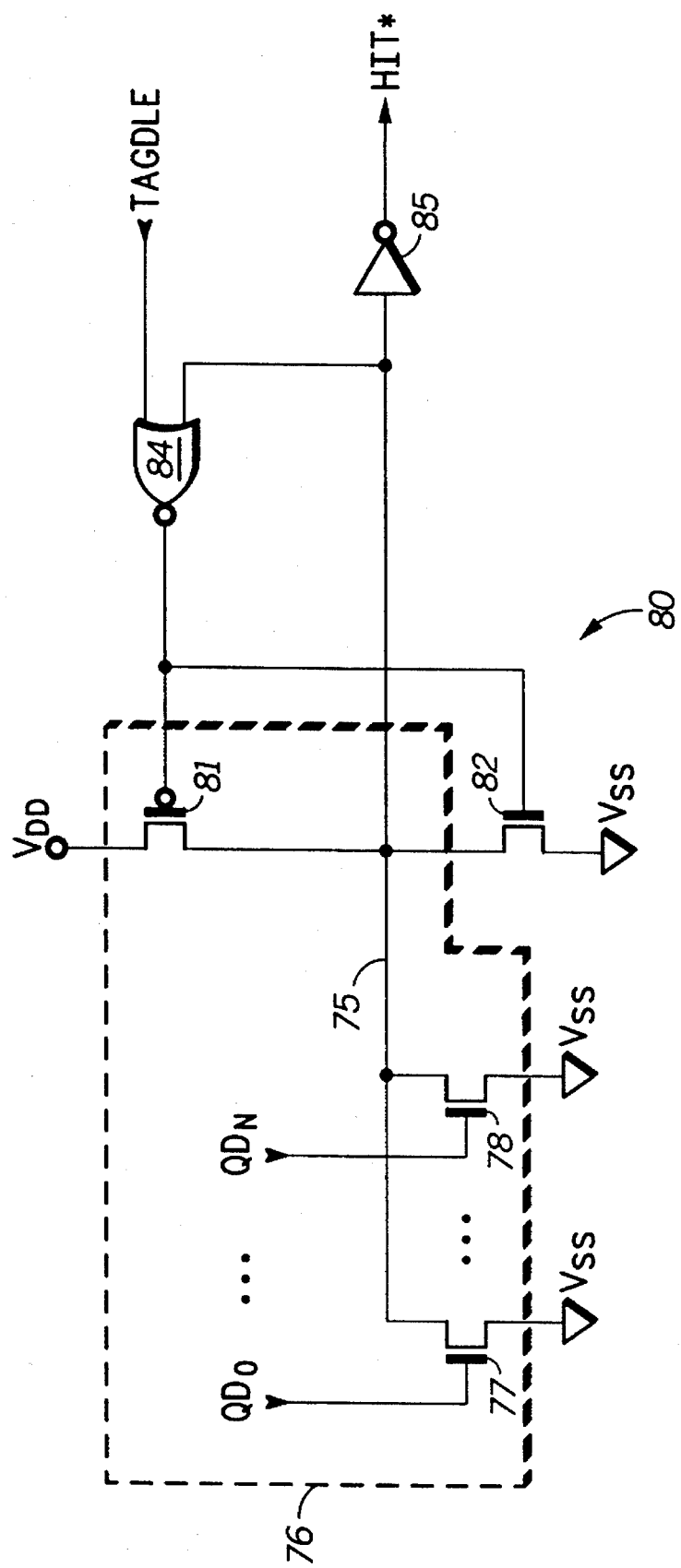
FIG. 4 illustrates in partial schematic diagram form and partial logic diagram form, one embodiment of the reduction circuit of FIG. 2.

FIG. 4 illustrates in partial schematic diagram form and partial logic diagram form, reduction circuit 39' as one embodiment of reduction circuit 39 of FIG. 2. Reduction circuit 39' includes precharged wired NOR logic circuit 76, latch circuit 80, and inverter 85. Precharged wired NOR logic circuit 76 includes N-channel transistors 77 and 78, and P-channel transistor 81. Latch circuit 80 includes N-channel transistor 82, NOR logic gate 84, and inverter 85. N-channel transistor 77 has a drain connected to conductor 75, a gate for receiving match signal $QD_0$, and a source connected to $V_{SS}$. N-channel transistor 78 has a drain connected to conductor 75, a gate for receiving match signal $QD_N$, and a source connected to $V_{SS}$. P-channel transistor 81 has a source connected to $V_{DD}$, a gate, and a drain connected to conductor 75. N-channel transistor 82 has a drain connected to conductor 75, a gate connected to the gate of P-channel transistor 81, and a source connected to $V_{SS}$. NOR logic gate 84 has a first input terminal for receiving control signal TAGDLE, a second input terminal coupled to conductor 75, and an output terminal connected to the gate of P-channel transistor 81. Inverter 85 has an input terminal connected to conductor 75, and an output terminal for providing hit signal HIT*.

During start-up of TAG array 26, match signals $QD_0$ and $QD_N$ are provided at logic low voltages. During normal operation, match signals $QD_0$ and $QD_N$, as used in reduction circuit 39' are CMOS level signals having a logic high voltage equal to about $V_{DD}$, and a logic low voltage equal to about $V_{SS}$. Note that in reduction circuit 39", illustrated in FIG. 5, match signals $QD_0$ and $QD_N$ are used at small signal levels, where a logic high is equal to about $V_{DD}$, and a logic low is equal to about $V_{DD}$-1.4 volts. When control signal TAGDLE is a logic high, NOR logic gate 84 provides a logic low voltage causing P-channel transistor 81 to be conductive and N-channel transistor 82 to be substantially non-conductive. Conductor 75 is precharged to a logic high voltage and hit signal HIT* is a logic low voltage. If any of match signals $QD_0$ through $QD_N$ are a logic high voltage, indicating that the logic state of the input address signal is not the same as the stored TAG address bit, then the corresponding one of N-channel transistors 77 and 78 is conductive, causing the voltage on conductor 75 to be reduced to a logic low voltage, which in turn, causes hit signal HIT* to be provided as a logic high, indicating a "miss" or that the input address signal does not have the same logic state as the stored TAG address bit.

If all of match signals $QD_0$ through $QD_N$ remain a logic low voltage, indicating that the logic state of the input address signal is the same as the stored TAG address bit, then the corresponding N-channel transistors 77 and 78 are substantially non-conductive, causing the voltage on conductor 75 to be a logic high voltage, which causes hit signal HIT* to be provided as a logic low, indicating a "hit".

Reduction circuit 39' provides an advantage of not requiring a reference voltage in order to determine a "hit" or a "miss". Also, because reduction circuit 39' is implemented in CMOS, power consumption is relatively low, so that reduction circuit 39' does not require complicated enabling circuitry.

Figure 5:
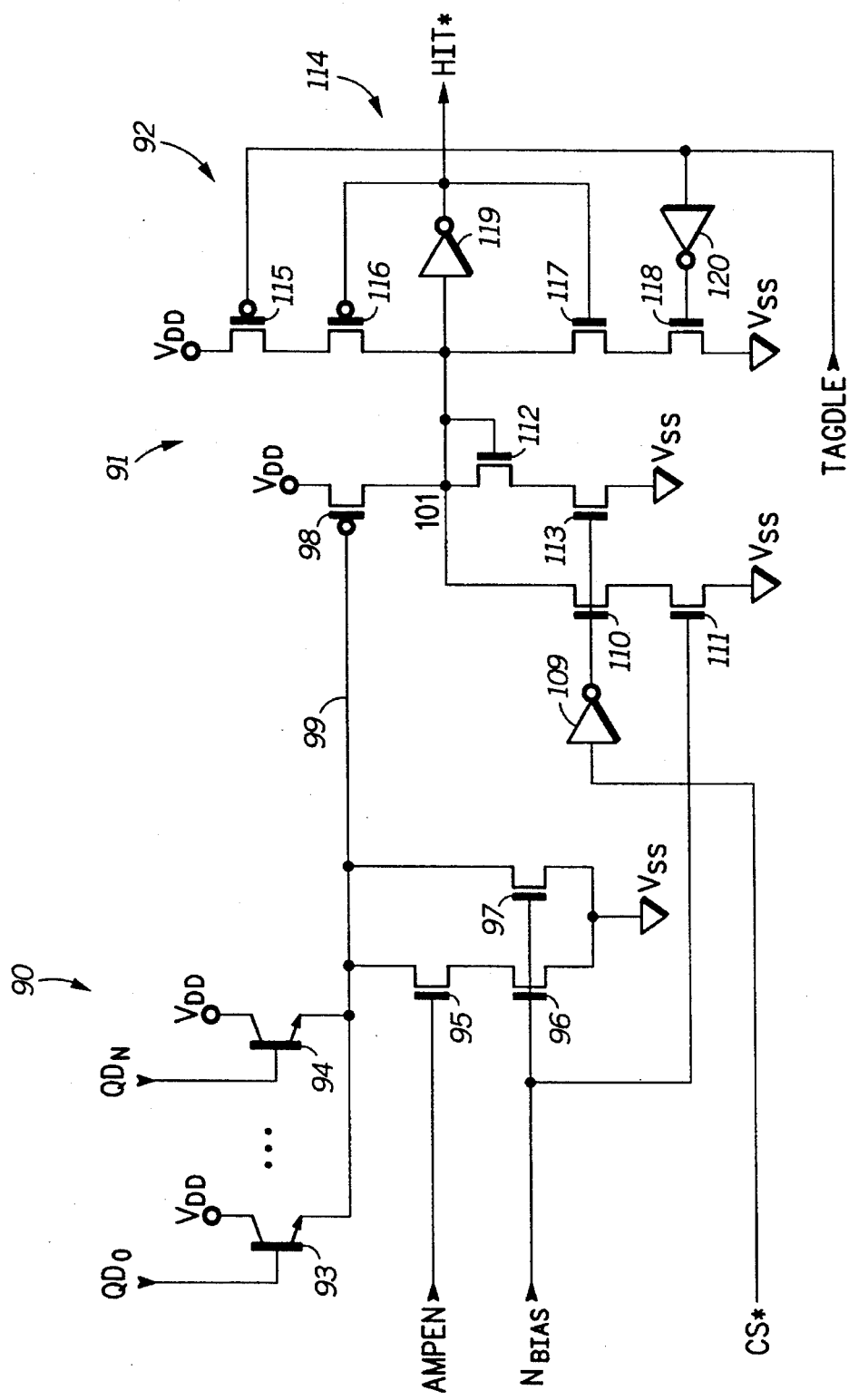
FIG. 5 illustrates in partial schematic diagram form and partial logic diagram form, another embodiment of the reduction circuit of FIG. 2.

FIG. 5 illustrates in partial schematic diagram form and partial logic diagram form, reduction circuit 39", as another embodiment of the reduction circuit 39 of FIG. 2. Reduction circuit 39" includes wired OR circuit 90, level converter circuit 91, and latch 92. Wired OR circuit 90 includes NPN transistors 93 and 94 and N-channel transistors 95–97. Level converter circuit 91 includes P-channel transistor 98, N-channel transistors 110–113, and inverter 109. Latch 92 includes P-channel transistors 115 and 116, N-channel transistors 117 and 118, and inverters 119 and 120. P-channel transistor 116 and N-channel transistor 117 form inverter 114.

NPN transistor 93 has a collector connected to $V_{DD}$, a base for receiving match signal $QD_0$, and an emitter connected to conductor 99. NPN transistor 94 has a collector connected to $V_{DD}$, a base for receiving match signal $QD_N$, and an emitter connected to conductor 99. N-channel transistor 95 has a drain connected to conductor 99, a gate for receiving an amplifier enable signal labeled "AMPEN", and a source. N-channel transistor 96 has a drain connected to the source of N-channel transistor 95, a gate for receiving bias voltage $N_{BIAS}$, and a source connected to $V_{SS}$. N-channel transistor 97 has a drain connected to the conductor 99, a gate for receiving bias voltage $N_{BIAS}$, and a source connected to $V_{SS}$.

P-channel transistor 98 has a source connected to $V_{DD}$, a gate connected to conductor 99, and a drain. N-channel transistor 110 has a drain connected to the drain of P-channel transistor 98, a gate, and a source. Inverter 109 has an input terminal for receiving a chip select signal labeled "CS*", and an output terminal connected to the gate of N-channel transistor 110. N-channel transistor 111 has a drain connected to the source of N-channel transistor 110, a gate for receiving bias voltage $N_{BIAS}$, and a source connected to $V_{SS}$. N-channel transistor 112 is diode-connected, having a drain and a gate connected to the drain of P-channel transistor 98, and a source. N-channel transistor 113 has a drain connected to the source of N-channel transistor 112, a gate connected to the output terminal of inverter 109, and a source connected to $V_{SS}$.

P-channel transistor 115 has a source connected to $V_{DD}$, a gate for receiving a control signal labeled "TAGDLE", and a drain. P-channel transistor 116 has a source connected to the drain of P-channel transistor 115, a gate, and a drain connected to the drain of P-channel transistor 98. Inverter 119 has an input terminal connected to the drain of P-channel transistor 98, and an output terminal connected to the gate of P-channel transistor 116 for providing hit signal HIT*. N-channel transistor 117 has a drain connected to the drain of P-channel transistor 116, a gate connected to the output terminal of inverter 119, and a source. N-channel transistor 118 has a drain connected to the source of N-channel transistor 117, a gate, and a source connected to $V_{SS}$. Inverter 120 has an input terminal for receiving control signal TAGDLE, and an output terminal connected to the gate of N-channel transistor 118.

In reduction circuit 39" of FIG. 5, match signals $QD_0$ and $QD_N$ are used at small signal levels, where a logic high is equal to about $V_{DD}$, and a logic low is equal to about $V_{DD}$-1.4 volts. However, in reduction circuit 39' of FIG. 4, match signals $QD_0$ and $QD_N$ are CMOS level signals where a logic high voltage is equal to about $V_{DD}$, and a logic low voltage equal to about $V_{SS}$.

During normal operation, amplifier enable signal AMPEN is asserted as a logic high, and chip select signal CS* is asserted as a logic low. A logic high amplifier enable signal AMPEN causes N-channel transistor 95 to be conductive, reducing a voltage on conductor 99 to a logic low voltage. N-channel transistors 96 and 97 function as current sources. N-channel transistor 97 is sized to be relatively small and functions to reduce the voltage on conductor 99. A logic low chip select signal CS* causes inverter 109 to provide a logic high voltage to the gates of N-channel transistors 110 and 113, which causes N-channel transistors 110 and 113 to be conductive. N-channel transistor 111 functions as a current source to reduce a voltage at node 101 to a logic low voltage when P-channel transistor 98 is substantially non-conductive. Diode-connected N-channel transistor 112 quickly discharges node 101 to a diode voltage drop above $V_{SS}$.

During start-up of TAG array 26, match signals $QD_0$ through $QD_N$ are at logic high voltages, causing the voltage on conductor 99 to be a logic high voltage. P-channel transistor 98 is substantially non-conductive, causing node 101 to be a logic low, and the output terminal of inverter 119 provides a logic high hit signal HIT*. During normal operation, match signals $QD_0$ through $QD_N$ are provided to the bases of NPN transistors including NPN transistors 93 and 94. If any one or more of NPN transistors 93–94 are provided with a logic high match signal $QD_0$ through $QD_N$, indicating that the logic state of a stored TAG address bit is not the same as the logic state of an input address signal, the NPN transistor receiving the logic high match signal is conductive, causing a voltage on conductor 99 to be increased to a logic high voltage. A logic high voltage on conductor 99 causes P-channel transistor 98 to be substantially nonconductive, causing the voltage at node 101 to be reduced to a logic low voltage. The logic low voltage at node 101 is provided to the input terminal of inverter 92, causing a logic high hit signal HIT* to be provided at the output terminal of inverter 119. If all of the match signals $QD_0$ through $QD_N$ remain at a logic low voltage during a comparison between the TAG address bits and the input address signals, then that indicates a match, and conductor 99 is at a logic low voltage. P-channel transistor 98 is conductive, causing node 101 to be a logic high voltage. Therefore, the output terminal of inverter 119 provides a logic low hit signal HIT*, indicating a "hit", and the data processing system accesses the cache memory for the required data or instructions.

When amplifier enable signal AMPEN is a logic low voltage, N-channel transistor 95 is substantially non-conductive, reducing a current through N-channel transistor 96. N-channel transistor 97 is sized to provide a minimum current flow to maintain conductor 99 at a discharged logic low voltage. Likewise, when chip select signal CS* is a logic high voltage, inverter 109 provides a logic low voltage to the gates of N-channel transistors 110 and 113, causing N-channel transistors 110 and 113 to be substantially non-conductive, reducing the current through N-channel transistors 111 and 112. Node 101 is maintained at a logic high voltage, causing a logic low hit signal HIT* to be provided at the output terminal of inverter 119.

If control signal TAGDLE is a logic low voltage, N-channel transistor 118 and P-channel transistor 115 are both conductive, causing inverters 114 and 119 of latch 92 to provide a latching function to temporarily hold the current logic state of hit signal HIT*. If control signal TAGDLE is a logic high voltage, N-channel transistor 118 and P-channel transistor 115 are both substantially nonconductive, providing a high impedance state for latch 92.

Reduction circuit 39" is relatively fast because it is implemented in BICMOS with a relatively small logic swing. Also level converter 91 of reduction circuit 39" only uses current when a match occurs. In addition, reduction circuit 39" does not need a reference voltage to do a comparison to generate a match signal. Since a reference voltage is not needed, reduction circuit 39" is simpler to implement. Note that a BICMOS integrated circuit includes bipolar and MOS (metal-oxide semiconductor) transistors on the same integrated circuit.

Reduction circuits 39' (FIG. 4) and reduction circuit 39" (FIG. 5) have some of the same and different advantages as compared to one another. Reduction circuit 39' provides an advantage of not requiring a reference voltage in order to determine a "hit" or a "miss". Also, because reduction circuit 39' in implemented in CMOS, power consumption is relatively low, eliminating the need for complicated enabling circuitry. Reduction circuit 39" also provides the advantage of not requiring a reference voltage in order to determine a "hit" or a "miss". Since a reference voltage is not needed, both of reduction circuits 39' and 39" are simpler to implement. Also, reduction circuit 39" is relatively faster because it is implemented in BICMOS with a relatively small logic swing.

Figure 6:
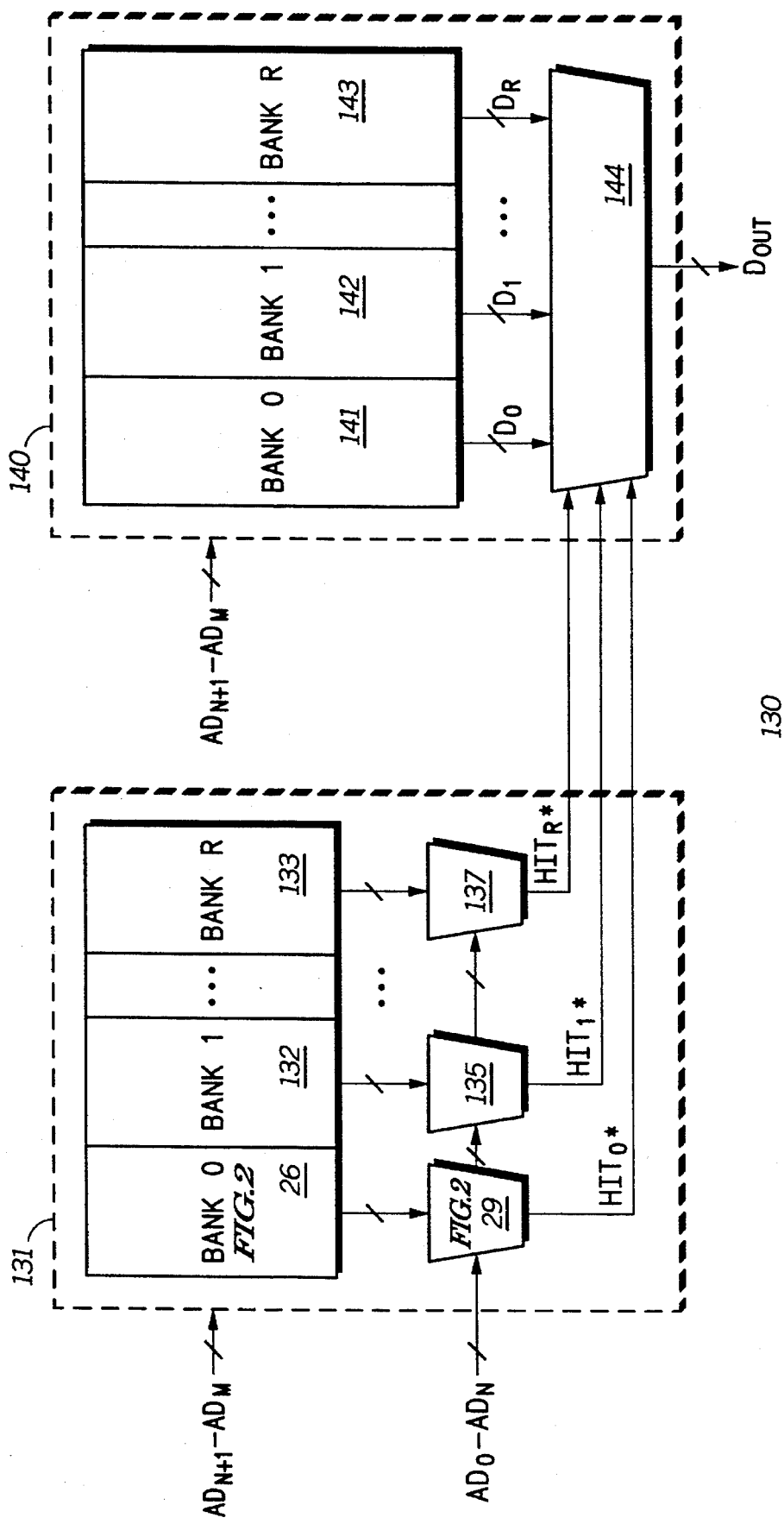
FIG. 6 illustrates in block diagram form, a multiple way set associative integrated cache incorporating the cache TAG RAM of FIG. 2.

FIG. 6 illustrates in block diagram form, multiple way set associative integrated cache 130 incorporating cache TAG RAM 25 of FIG. 2. Integrated cache 130 includes banks of cache TAG RAM 131 and banks of data RAM 140. Banks of cache TAG RAM 131 includes banks 26, 132, and 133, and comparators 29, 135, and 137. Banks of data RAM 140 includes banks 141, 142, and 143, and multiplexer 144.

In the past, cache memory was constructed of cache RAM and cache TAG RAM on separate integrated circuits assembled on printed circuit boards to form modules. A multiple way set associative integrated cache includes multiple banks of TAG RAM, multiple banks of data RAM, and a cache controller on the same integrated circuit substrate to increase the operating speed of the cache memory, reduce costs, and to reduce the size of the cache memory.

In operation, an address of data or instructions required by a data processing system (not shown) is provided to integrated cache 130. The higher order address bits ADO- ADN of the address are provided to comparators 29, 135, and 137, while the lower order address bits $AD_{N+1}$-ADM are provided to the banks of cache TAG RAM 26, 132, and 133, and to the banks of data RAM 141, 142, and 143. Note that decoding circuits for accessing memory cells of the banks of cache TAG RAM and the banks of data RAM are not important for purposes of describing the invention, and are therefore not shown. The higher order address bits $AD_0$-$AD_N$ are compared to a TAG address stored in the banks of cache TAG RAM 131. The banks of cache TAG RAM 131 are accessed by using the lower order address bits $AD_{N+1}$- ADM. If the requested data or instructions are located in the banks of data RAM 140, one of the comparator circuits 29, 135, or 137 will provide a hit signal to multiplexer 144 to allow the data or instructions located in the corresponding data RAM 141,142, or 143 to be output as data signals DOUT to the data processor. The comparison operation is described in the previous FIGS. 2–5 and the accompanying text. If a compare operation in integrated cache 130 indicates that the requested data or instructions in not in cache memory, then the data processor must go to main memory to retrieve the required data or instructions.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

What is claimed is:

1. A cache TAG RAM, comprising:

a plurality of memory cells for storing TAG addresses corresponding to address locations of data stored in a cache memory, a TAG address having a predetermined number of bits, the plurality of memory cells providing the TAG address in response to receiving an input address;

a first plurality of exclusive OR logic circuits, each exclusive OR circuit of the first plurality of exclusive OR logic circuits having an input terminal coupled to the plurality of memory cells, for receiving a data signal corresponding to a TAG address bit of the TAG address, each exclusive OR circuit for comparing a logic state of the data signal to a logic state of an input TAG address signal, and in response, providing a match signal of a predetermined logic state at an output terminal;

a plurality of transistors, the plurality of transistors each having a control electrode coupled to the output terminal of each exclusive OR logic circuit of the first plurality of exclusive OR logic circuits, a first current electrode of each transistor of the plurality of transistors coupled together, and a second current electrode coupled to a first power supply voltage terminal; and a second plurality of exclusive OR logic circuits, an exclusive OR logic circuit of the second plurality of exclusive OR logic circuits having an input terminal coupled to the output terminal of a corresponding one of the first plurality of exclusive OR logic circuits, the exclusive OR logic circuit of the second plurality of exclusive OR logic circuits for comparing the logic state of a corresponding match signal to the logic state of an input TAG address signal, and providing an output data signal having a logic state corresponding to the logic state of the TAG address bit.

2. The cache TAG RAM of claim 1, wherein the plurality of memory cells are characterized as being a plurality of static random access memory cells.

3. The cache TAG RAM of claim 1, wherein the first power supply voltage terminal is coupled to ground potential.

4. The cache TAG RAM of claim 1, wherein the plurality of transistors comprises a plurality of N-channel transistors.

5. The cache TAG RAM of claim 4, further comprising:

a first transistor having a first current electrode coupled to a second power supply voltage terminal, a control electrode, and a second current electrode coupled to the first current electrode of each of the plurality of transistors;

a second transistor having a first current electrode coupled to the first current electrode of each of the plurality of transistors, a control electrode coupled to the control electrode of the first transistor, and a second current electrode coupled to the first power supply voltage terminal;

a NOR logic gate having a first input terminal for receiving a control signal, a second input terminal coupled to the first current electrode of each of the plurality of transistors, and an output terminal coupled to the control electrodes of the first and second transistors; and an inverter having an input terminal coupled to the first current electrode of each of the plurality of transistors, and an output terminal for providing a hit signal.

6. The cache TAG RAM of claim 5, wherein the first transistor is an P-channel transistor and the second transistor is a N-channel transistor.

7. The cache TAG RAM of claim 1, wherein the plurality of transistors comprises a plurality of NPN transistors, wherein the second current electrodes are characterized as being collectors, the control electrodes are characterized as being bases, and the first current electrodes are characterized as being emitters.

8. The cache TAG RAM of claim 7, further comprising:
   a level converter circuit having an input terminal coupled to the emitters of the plurality of NPN transistors, and an output node; and
   a latch having an input terminal coupled to the output node, and an output terminal for providing a hit signal.

9. The cache TAG RAM of claim 8, wherein the level converter circuit comprises:
   a P-channel transistor having a source connected to the first power supply voltage terminal, a gate coupled to the emitters of the plurality of NPN transistors, and a drain coupled to the output node;
   a first N-channel transistor having a both a gate and a drain coupled to the output node, and a source; and
   a second N-channel transistor having a drain coupled to the source of the first N-channel transistor, and gate for receiving a control signal, and a source coupled to a second power supply voltage terminal.

10. The cache TAG RAM of claim 9, wherein the first power supply voltage terminal is coupled to a positive power supply voltage, and the second power supply voltage terminal is coupled to ground.

11. A cache TAG RAM, comprising:
   a plurality of memory cells for storing TAG addresses corresponding to address locations of data stored in a cache memory, a TAG address having a predetermined number of bits, the plurality of memory cells providing the TAG address in response to receiving an input address;
   a plurality of exclusive OR logic circuits, each exclusive OR circuit of the plurality of exclusive OR logic circuits having an input terminal coupled to the plurality of memory cells, for receiving a data signal corresponding to a TAG address bit of the TAG address, each exclusive OR circuit for comparing a logic state of the data signal to a logic state of an input TAG address signal, and in response, providing a match signal of a predetermined logic state at an output terminal;
   a plurality of first N-channel transistors having a drain connected together, a gate coupled to the output terminals of the plurality of exclusive OR logic circuits, and a source coupled to a first power supply voltage terminal;
   a P-channel transistor having a source coupled to a second power supply voltage terminal, a gate, and a drain coupled to the drains of the plurality of first N-channel transistors;
   a second N-channel transistor having a drain coupled to the drains of the plurality of first N-channel transistors, a gate coupled to the gate of the P-channel transistor, and a source coupled to the first power supply voltage terminal;
   a NOR logic gate having a first input terminal for receiving a control signal, a second input terminal coupled to the drains of the plurality of first N-channel transistors, and an output terminal coupled to the gates of both of the P channel transistor and second N-channel transistor; and
   an inverter having an input terminal coupled to the drains of the plurality of first N-channel transistors, and an output terminal for providing a hit signal.

12. The cache TAG RAM of claim 11, wherein the plurality of memory cells are characterized as being a plurality of static random access memory cells.

13. The cache TAG RAM of claim 11, wherein the first power supply voltage terminal is coupled to ground potential and the second power supply voltage terminal is coupled to a positive power supply voltage.

14. A cache TAG RAM, comprising:
   a plurality of memory cells for storing TAG addresses corresponding to address locations of data stored in a cache memory, a TAG address having a predetermined number of bits, the plurality of memory cells providing the TAG address in response to receiving an input address;
   a plurality of exclusive OR logic circuits, each exclusive OR circuit of the plurality of exclusive OR logic circuits having an input terminal coupled to the plurality of memory cells, for receiving a data signal corresponding to a TAG address bit of the TAG address, each exclusive OR circuit for comparing a logic state of the data signal to a logic state of an input TAG address signal, and in response, providing a match signal of a predetermined logic state at an output terminal;
   a plurality of NPN transistors, each NPN transistor of the plurality of NPN transistors having a collector coupled to a first power supply voltage terminal, a base coupled to the output terminals of the plurality of exclusive OR logic circuits, and emitters coupled together;
   a level converter circuit having an input terminal coupled to the emitters of the plurality of NPN transistors, and an output node; and
   a latch having an input terminal coupled to the output node, and an output terminal for providing a hit signal.

15. The cache TAG RAM of claim 14, wherein the level converter circuit comprises:
   a P-channel transistor having a source connected to the first power supply voltage terminal, a gate coupled to the emitters of the plurality of NPN transistors, and a drain coupled to the output node;
   a first N-channel transistor having a both a gate and a drain coupled to the output node, and a source; and
   a second N-channel transistor having a drain coupled to the source of the first N-channel transistor, and gate for receiving a control signal, and a source coupled to a second power supply voltage terminal.

16. The cache TAG RAM of claim 15, wherein the first power supply voltage terminal is coupled to a positive power supply voltage, and the second power supply voltage terminal is coupled to ground.

17. The cache TAG RAM of claim 14, wherein the plurality of memory cells comprises a plurality of static random access memory cells.

* * * * *